United States Patent [19]

Ueda et al.

[11] Patent Number: 4,692,627

[45] Date of Patent: Sep. 8, 1987

[54] ION BEAM GENERATOR

[75] Inventors: Yoshihiro Ueda; Kouichi Ono; Tatsuo Oomori; Shigeto Fujita, all of Amagasaki, Japan

[73] Assignee: Mitsubishi Denki Kabushiki Kaisha, Tokyo, Japan

[21] Appl. No.: 782,541

[22] Filed: Oct. 1, 1985

[51] Int. Cl.[4] ........................ H01J 37/08; H01J 27/24

[52] U.S. Cl. ............................ 250/423 P; 250/423 R; 250/423 F

[58] Field of Search ............ 250/423 P, 423 R, 423 F, 250/424, 425, 426, 427; 204/DIG. 1

[56] References Cited

U.S. PATENT DOCUMENTS

| | | | |
|---|---|---|---|
| 3,987,302 | 10/1976 | Hurst et al. | 250/423 P |
| 4,107,537 | 8/1978 | Forsen et al. | 250/423 P |
| 4,148,612 | 4/1979 | Taylor et al. | 436/38 |
| 4,166,219 | 8/1979 | Ausschnitt et al. | 250/423 P |
| 4,297,191 | 10/1981 | Chen | 250/423 P |
| 4,536,657 | 8/1985 | Bruel | 250/423 P |

*Primary Examiner*—Carolyn E. Fields
*Assistant Examiner*—Paul A. Guss
*Attorney, Agent, or Firm*—Birch, Stewart, Kolasch & Birch

[57] ABSTRACT

An ion beam generator includes: an ion generating section for generating ions and where the material to be ionized is introduced; a gas discharge device for exciting the material to be ionized to a low excited state; a light source for introducing a light into the ion generating section, which light has a wavelength such that it excites the material to be ionized to an intermediate state from the low excited state of the material by a resonance excitation; and the specific material to be taken out as an ion beam being selectively ionized through the intermediate state.

30 Claims, 15 Drawing Figures

ION BEAM GENERATOR

FIELD OF THE INVENTION

The present invention relates to an ion beam generator used for material improvement or material synthesization in such a device as a semiconductor processing device.

BACKGROUND OF THE INVENTION

Conventionally, various kinds of methods are proposed and put into practice for generating ions in an ion beam generator. Contrary to the idea that almost all of methods are ones utilizing a discharge, ion sources utilizing laser lights have been recently developed. There are two ionizing methods utilizing laser lights. One of them uses plasma as an ion source which plasma are generated by irradiating lights, such as laser light, to solid material, such as metal, or by irradiating a bunching laser light to a gas or liquid material. The second method is one which ionizes the material by making a laser light of mono-wavelength resonate with the energy level of the material to be ionized using a variable wavelength laser. The present invention relates to this latter type of ion beam generator.

SUMMARY OF THE INVENTION

The object of the present invention is to provide an ion beam generator capable of enhancing the ionization efficiency pe̊r input light energy by several figures or more as compared with the conventional resonance excitation ionization method.

Another object of the present invention is to provide an ion beam generator superior in the selectivity of the selective ionization.

Other objects and advantages of the present invention will become apparent from the detailed description given hereinafter; it should be understood, however, that the detailed description and specific embodiments are given by way of illustration only, since various changes and modifications within the spirit and scope of the invention will become apparent to those skilled in the art from this detailed description.

According to the present invention, there is provided an ion beam generator, which comprises: an ion generating section for generating ions and where the material to be ionized is introduced; a gas discharge means for exciting the material to be ionized to a low excited state; a light source for introducing a light into the ion generating section, which light has a wavelength such that it excites thematerial to be ionized to an intermediate state from the low excited state of the material by a resonance excitation; and the specific material to be taken out as an ion beam being selectively ionized through the intermediate state.

DETAILED DESCRIPTION OF THE PREFERRED EMBODIMENTS

A first embodiment of the present invention will be described in detail with reference to FIGS. 1 to 8.

Figure 1:
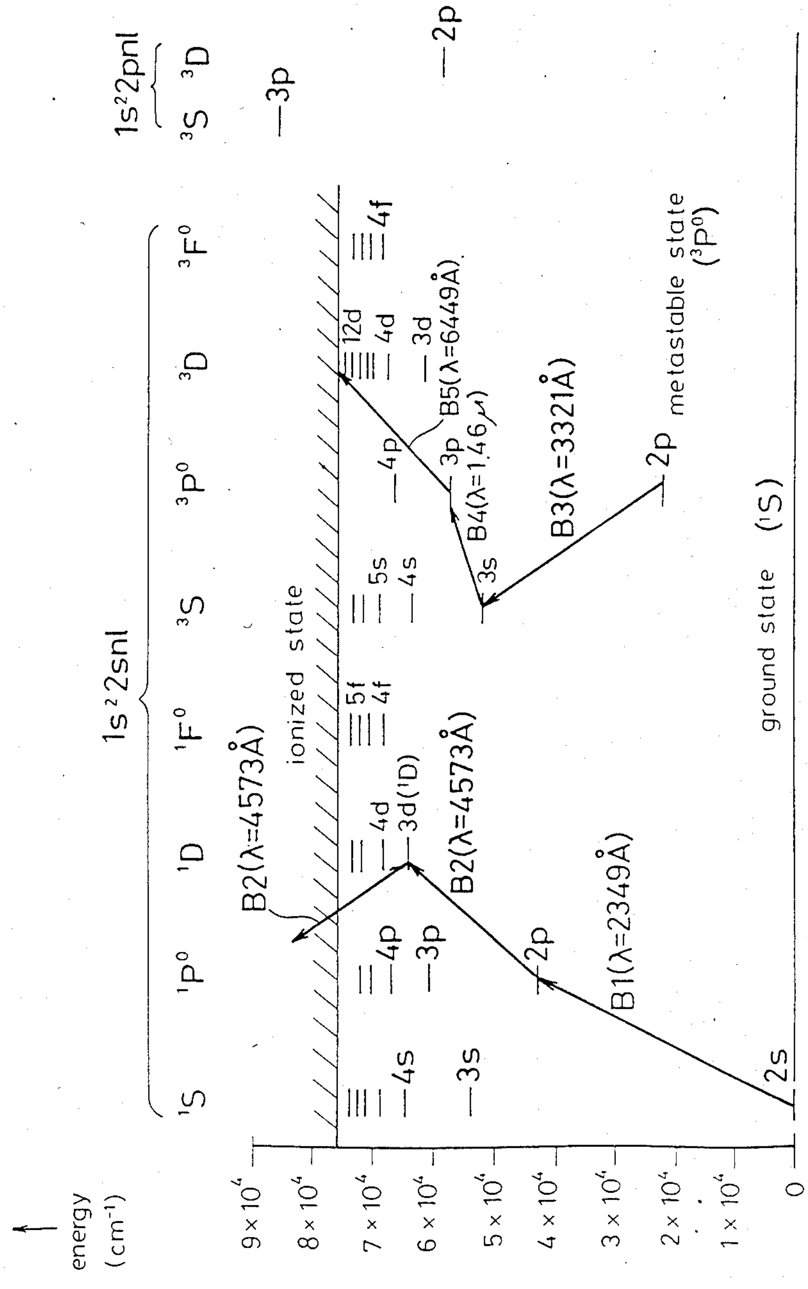
FIG. 1 is a diagram showing the energy levels for a singlet term beryllium neutral atom and the ionization method of the first embodiment of the present invention together with the conventional method.

FIG. 1 shows the energy levels for a singlet term beryllium neutral atom and the ionization method of the first embodiment together with the conventional method.

According to the conventional ionization method, two laser beams B1, B2 of wavelength 2349 Å and 4573 Å are irradiated to the beryllium vapor to be ionized. Then, the beryllium atom at the ground state 2*s*(hu 1S) is at first resonance excited to the first excited state 2*p*($^1P^0$) by the laser beam B1 of 2349 Å, and thereafter it is resonance excited to the energy level 3*d*($^1$D) by the laser beam B2 of 4573 Å, and furthermore it is ionized by the laser beam B2 of 4573 Å.

On the other hand, according to the first embodiment of the present invention, the beryllium vapor is resonance excited by a gas discharge to an excited state where the metastable state 2*p*($^3P^0$) is dominant, and the excited vapor is stepwisely resonance excited to the Rydberg state from the excited state by three laser beams B3 of wavelength 3321 Å, B4 of 1.46 μm, B5 of 6449 Å, and the excited vapor at the Rydberg state is ionized by applying an electric field to the excited vapor so as to generate Stark effect or by applying a gas discharge to the excited vapor. In the case of applying an electric field the following value of the electric field is proper to be applied to the excited vapor.

$$E(V/cm)=0.3125\times10^{9}\cdot n^{-4}$$

where n designates an effective main quantum number.

In a case of applying a gas discharge the excited vapor is ionized by such as electron collisions occured caused by the gas discharge.

The ionization method of this first embodiment has an advantage in that the collision cross-sectional area at the ionization is higher by several figures or more than the conventional method which directly ionizes the beryllium vapor from the energy level $3d(^1D)$ by the laser beam of 4573 Å, thereby enabling to lower the output energy of the laser beam. The wavelength of light beams are enough to be short because the beryllium is ionized not from the ground state but from the metastable state. Furthermore, it is possible to selectively ionize only the material to be ionized by selecting the wavelength of the laser beam so as to not concide with the energy level of impurity atoms because the present invention utilizes selectively resonances.

Furthermore, it is easily possible to generate ion beams of other materials by varying the wavelengths of the laser beam and the intensity of the electric field or the condition of the gas discharge. For that purpose, many kinds of materials to be ionized may be previously introduced into the container of the ion beam generator. This further provides capability of conducting two or more ion beam processings successively.

Figure 2:
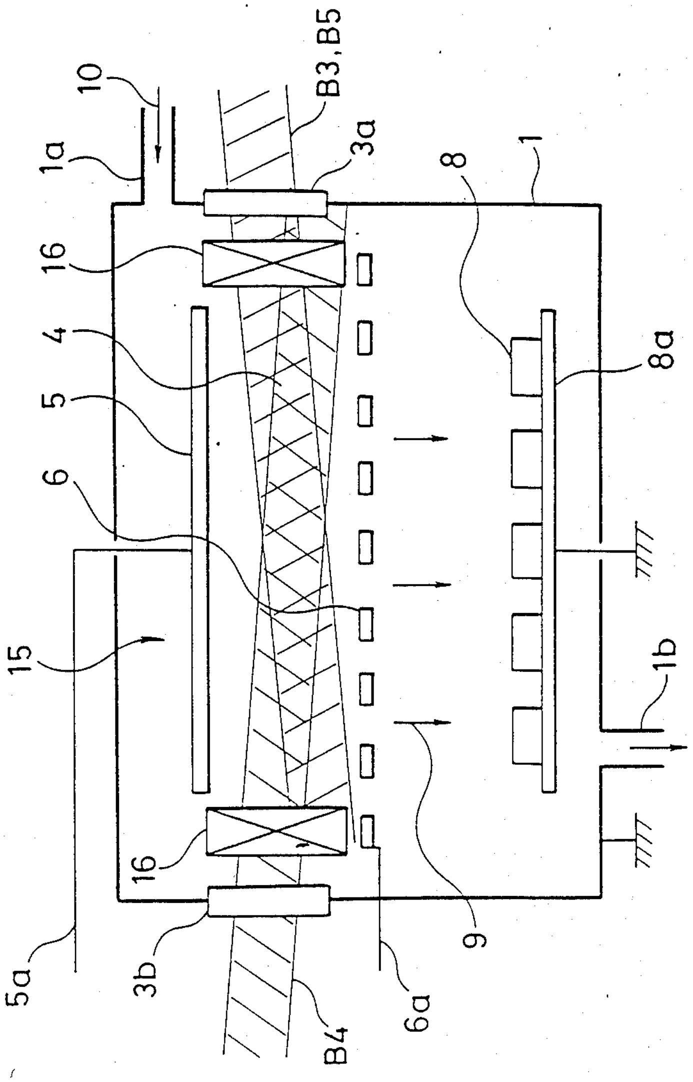
FIG. 2 is a diagram showing a cross-section of a shower type ion beam generator as a first embodiment of the present invention.

FIG. 2 shows a shower type ion beam generator as a first embodiment of the present invention which conducts an ionization of beryllium by a stepwise resonance excitation using laser beams B3 to B5 shown in FIG. 1.

The reference numeral 1 designates a container into which the material to be ionized is introduced. The numeral 1*a* designates a gas inlet for introducing the material vapor which is, for example, generated by heating and evaporating solid or liquid material into the container 1. The numeral 1*b* designates a gas outlet. The numerals 3*a* and 3*b* designate windows for introducing laser beams B3, B5 and B4 from the laser beam generator (not shown in FIG. 2) into the container 1, respectively. There is provided an ion generating space 4 where the laser beams B3, B5 and B4 intersect with each other. Lasers such as a variable wavelength laser or a free electron laser are used for the laser beam generator.

The numerals 5 and 6 designate electrodes arranged so as to locate the ion generating space 4 therebetween. The numerals 5*a* and 6*a* designate terminals for applying voltages to the electrodes 5 and 6, respectively. These electrodes 5, 6 and terminals 5*a*, 6*a* constitute an electric field generator or gas discharge means 15 for applying an electric field or RF gas discharge for ionizing the material to the ion generating space 4. The numeral 16 designates an induction coil also arranged so as to locate the ion generating space 4 therebetween. This induction coil 16 constitutes a gas discharge means which generates an RF discharge at the ion generating space 4. The numeral 8 designates an object material such as a semiconductor substrate to which the generated ion beam should be irradiated. The numeral 8*a* designates a material support for supporting the object material 8. A dc voltage is applied to between the material support 8*a* and the electrode 6 so as to produce an electric field for taking out the ionized material as an ion beam.

The device is operated as follows:

At first, beryllium vapor 10 is introduced into the container 1 from the gas inlet 1*a*. An RF discharge is generated by the induction coil 16, and at the same time the laser beam generator starts to oscillate. And synchronous with the laser oscillation, a voltage is applied to between the electrodes 5 and 6 through the terminals 5*a*, 6*a* and to the induction coil 16. Thus, laser beams B3, B5 of 3321 Å, 6449 Å generated by the laser beam generator are introduced into the container 1 through the window 3*a*, and a laser beam B4 of 1.46 $\mu$m also generated by the laser beam generator is introduced into the container 1 through the window 3*b*, and the laser beams B3, B5 and B4 intersect with each other at the ion generating space 4 in the container 1. The beryllium vapor 10 is at first excited to the metastable state $2p(^3P^0)$ by the collisions of electrons generated by the RF discharge which is generated by the induction coil 16 or the electrodes 5 and 6 to the beryllium vapor 10 at the ground state $2s(^1S)$, and thereafter the beryllium vapor 10 is resonance excited by the laser beam B3 of 3321 Å to the excited state $3s(^1S^0)$ from the metastable state $2p(^3P^0)$, and it is excited by the laser beam B4 of 1.46$\mu$ m to the excited state $3p(^3P^0)$ from the excited state $3s(^1S^0)$, and it is excited by the laser beam of 6449 Å to the Rydberg state $12d(^3D)$ from the excited state $3p(^3P^0)$ stepwisely.

Finally, the beryllium vapor 10 at the Rydberg state $12d(^3D)$ is ionized by Stark effect generated by the application of the electric field to the excited vapor or by the RF gas discharge. A dc voltage is applied between the electrode 6 and the material support 8*a*, whereby the ionized beryllium vapor 10 is taken out to be irradiated to the object material 8 as an ion beam 9 consisting of only beryllium ions.

The features of this first embodiment are as follows:

Firstly, in this first embodiment which conducts a selective ionization by utilizing perfectly only resonances, it is possible to obtain a pure beryllium ion beam consisting of only beryllium ions by making the wavelength of the laser beam not to coincide with the energy level of impurities even if impurities other than beryllium to be ionized such as oxygen, nitrogen, carbon, or hydrogen are contained in the container 1.

Secondly, in this first embodiment which conducts a selective ionization by a resonance excitation, electrons or other elements may not be excited, or may not be heated by an energy absorption. As a result, the object material 8 such as a semiconductor substrate to which the ion beam is to be irradiated may not be heated, thereby enabling a low temperature processing to be conducted.

Thirdly, in order to change the kind and the characteristics of the ion beam it is enough to change the wavelength of the laser beam and the intensity of the electric field or the condition of the gas discharge. and it is not required to open or close the container for the purpose of taking out the object material or interchanging the ion generating source as required in the conventional device. Accordingly, it is easily possible to conduct a continuous processing of ion injection and annealing, or the like.

Figure 3:
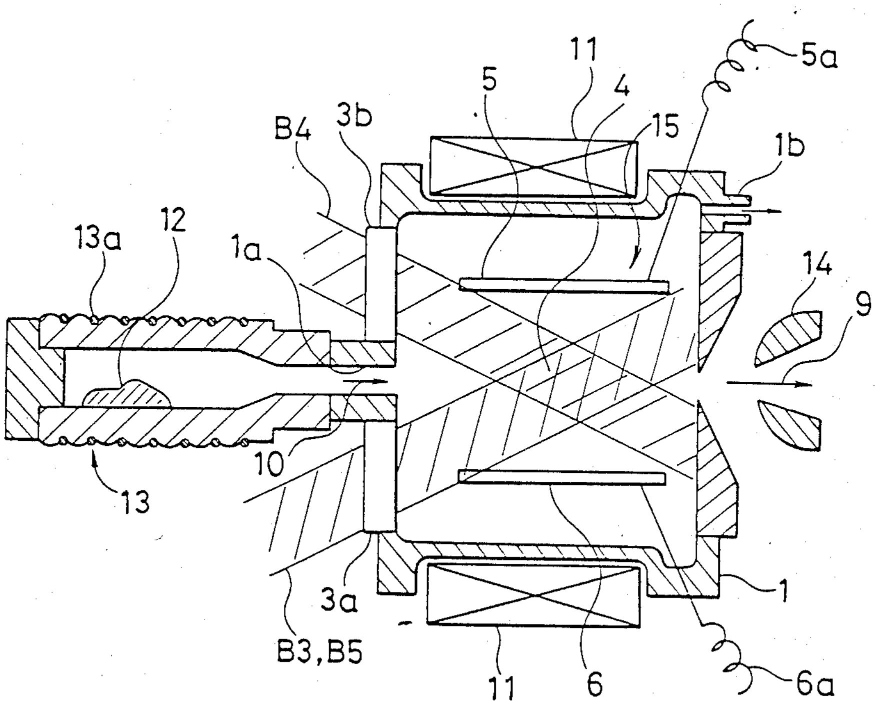
FIG. 3 is a diagram shwoing a cross-section of a bunching type ion beam generator as a modified version of the first embodiment.

FIG. 3 shows a bunching type ion beam generator as a modified version of the first embodiment.

The same reference numerals designate the same or corresponding elements as those shown in FIG. 2. The reference numeral 13 designates an oven containing the material (beryllium) 12 to be ionized. The numeral 13*a* designates a heater provided surrouding the oven 13. The numeral 11 designates a magnet for bunching the ionized beryllium vapor 10 into the axial center of the container 1. The numeral 14 designates an electrode for taking out the beryllium vapor 10 as an ion beam 9.

This device is operated as follows:

Beryllium to be ionized 12 is inserted into the oven 13, and the oven 13 is heated by the heater 13*a*. Then, beryllium 12 is melted and vaporized to generate a beryllium vapor 10, and the vapor 10 is introduced into the container 1 through the gas inlet 1*a*. The laser beam B3, B5 of 3321 Å, 6449 Å and the laser beam B4 of 1.46 μm are introduced into the container 1 through the windows 3*a*, 3*b*, respectively, to be irradiated to the vapor 10, and at the same time a voltage is applied to between the electrodes 5 and 6 so as to generate an RF gas discharge and an electric field both of which are to be applied to the vapor 10. Then, the vapor is excited to the metastable state $2p(^3P^0)$ from the ground state $2s(^1S)$ by the RF gas discharge, and it is stepwisely resonance excited by the laser beams B3, B5, B4 to the Rydberg state $12d(^3D)$ from the metastable state $2p(^33^0)$ through the excited states $3s(^1S^0)$, $3p(^3P^0)$. Furthermore, an electron of the atom of the vapor 10 at the Rydberg state $12d(^3D)$ is separated from the atom to become a free electron by Stark effect or the gas discharge, thereby resulting in a beryllium ion. This beryllium ion is bunched into the axial center by the magnet 11, and is taken out as an ion beam 9 by the taking out electrode 14.

Figure 4:
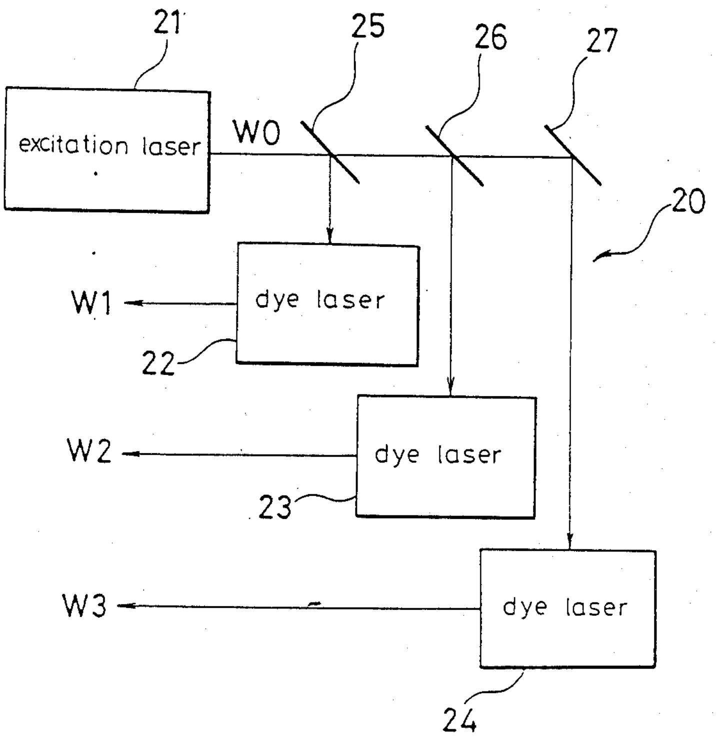
FIG. 4 is a schematic diagram showing a construction of the laser beam generator of the first embodiment using dye lasers excited by an excitation laser.

FIG. 4 shows a construction of the laser beam generator of the first embodiment.

The laser beams and the electric field employed in this first embodiment to generate ions should be generated synchronously with each other. The construction of FIG. 4 enables this synchronous operation.

The laser beam generator 20 is constituted by three variable wavelength dye lasers 22, 23, 24, an excitation laser 21 for exciting the dye lasers 22, 23, 24, two half mirrors 25, 26, and a total reflection mirror 27. The reference numeral W0 designates a laser output of the excitation laser 21, and the numerals W1, W2, W3 designate laser outputs of the dye lasers 22, 23, 24, respectively. In this construction, the exciter for exciting the three lasers is constituted by one laser 21, whereby the laser beams W1, W2, W3 are synchronous. A gas laser such as an excima or nitrogen gas laser can be used as an excitation laser for exciting dye lasers. Of course, such gas lasers can be used as not an excitation laser but an output laser itself. Furthermore, solid lasers such as an alexandrite laser can be used as an excitation laser for exciting dye lasers by its higher harmonic, and of course such solid lasers can be used as not an excitation laser but an output laser itself. The generation of RF discharge and of the electric field can be conducted synchronously with the generation of the laser beams by conducting the voltage application to the electrodes 5 and 6 (and to the induction coil 16) synchronously with the oscillation of the excitation laser 21.

Figure 5:
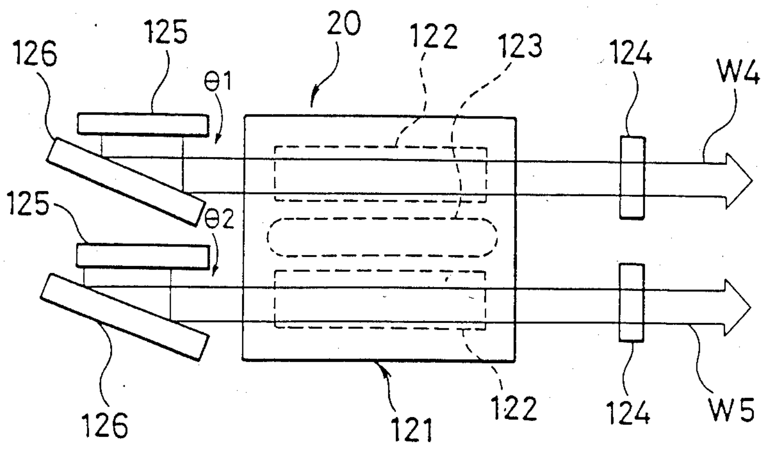
FIGS. 5 and 6 are schematic diagrams showing a first modified version of the laser beam generator of the first embodiment using dye lasers excited by a flash lamp.
Figure 6:
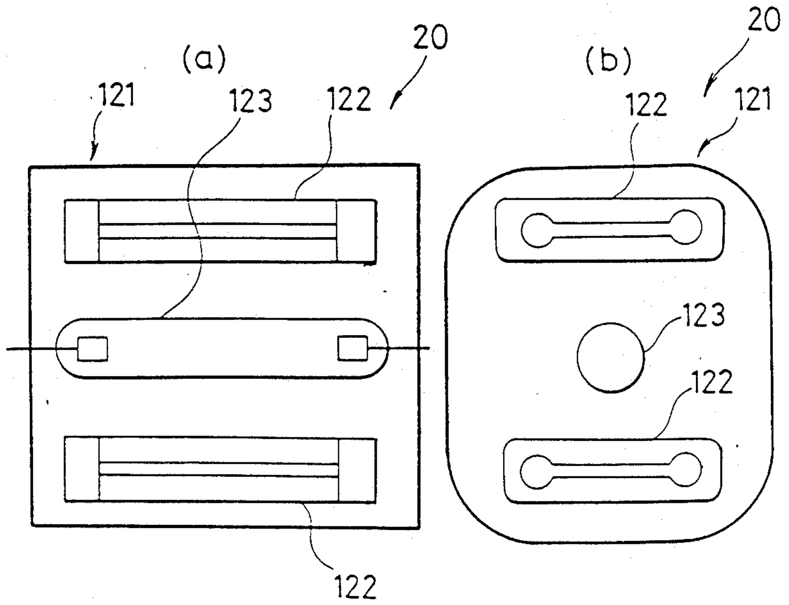

FIGS. 5 and 6 show a first modified version of the laser beam generator 20 of the first embodiment.

This first modified version also enables the synchronous operation. The reference numeral 121 designates a reflection mirror cell of the laser beam generator 20. The numeral 122 designates a dye laser cell. The numeral 123 designates a flash lamp. The numeral 124 designates a mirror. The numeral 125 designates a plane mirror. The numeral 126 designates a diffraction lattice. The numerals W1, W2 designate laser beams.

In this first modified version, two dye laser cells 122 are excited by a flash lamp 123, whereby two dye laser beams W4, W5 having different wavelengths are oscillated synchronously with each other.

It is possible to differentiate the wavelengths of the laser beams W4 and W5 by using dye laser cells 122 having different dyes or by varying the angles θ1 and θ2 between the plane mirrors 125 and the diffraction lattices 126. By these differentiation of the wavelengths of the laser beams it is possible to select the wavelength with which the material to be ionized is to be resonated. Also it is possible to make the laser beams synchronous with each other. In this way, it is possible to excite the material by a stepwise resonance excitation. It is possible to make the laser beams, the RF gas discharge, and the electric field synchronous with together by conducting the starting of the flash lamp 123 and the voltage application to the electrodes 5 and 6 (and to the induction coil 16) at the same time.

Figure 7:
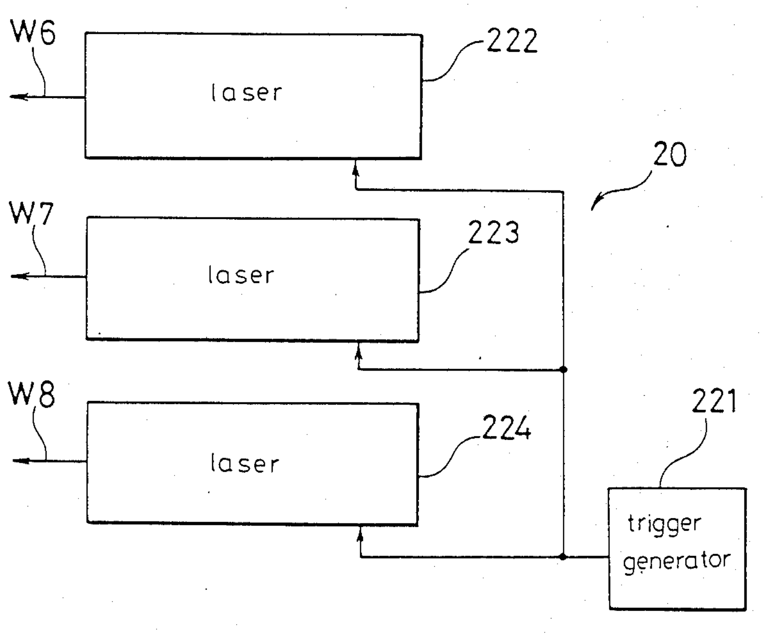
FIGS. 7 and 8 are schematic diagrams showing second and a third modified versions of the laser beam generator of the first embodiment, respectively, both using lasers triggered by an electric signal.

FIG. 7 shows a second modified version of the laser beam generator 20 of the first embodiment.

This second modified version also enables synchronous operation. This laser beam generator 20 is constituted by three lasers 222, 223, 224 having different wavelengths, and a trigger generator 221 which gives an electric pulse signal to the lasers 222 to 224 for triggering the laser oscillation. In this construction all three of the lasers 222 to 224 are triggered to oscillate by a trigger pulse from one trigger generator 221, whereby laser beams W6, W7, W8 are made synchronous with each other. The generation of the RF discharge and the application of the electric field can be conducted synchronously with the generation of the laser beams by conducting the voltage application to the electrodes 5 and 6 (and to the induction coil 16) synchronously with the pulse generation by the trigger generator 221.

Figure 8:
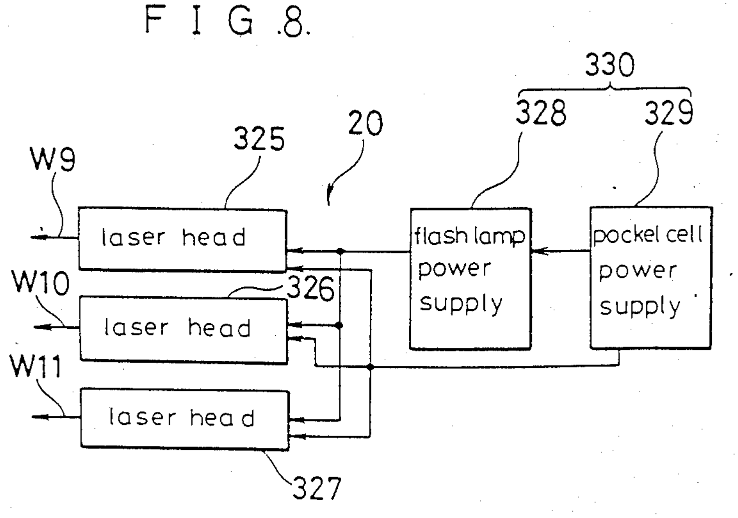

FIG. 8 shows a third modified version of the laser beam generator 20 of the first embodiment.

The reference numerals 325 to 327 designate laser heads of solid lasers. The numeral 328 and 329 designate a flash lamp power supply and a pockel cell power supply for Q switch, respectively. The both of the power supplies 328 and 329 function as a trigger means 330 for triggering the lasers 325 to 327. In this third modified version the laser heads 325 to 327 commonly use a set of power supplies 328 and 329, whereby the laser beams W9 to W11 are made synchronous with each other.

In this first embodiment the metastable state is used as the relatively low excited state from which the material is resonance excited to the Rydberg state, but the relatively low excited state of the present invention is not limited thereto.

In the first embodiment beryllium is introduced into the container 1 as a monomer vapor, but the material may be introduced into the container 1 as a gas of compound or molecular state, and the gas discharge may also function to make the introduced material a neutral atomic state.

Figure 9:
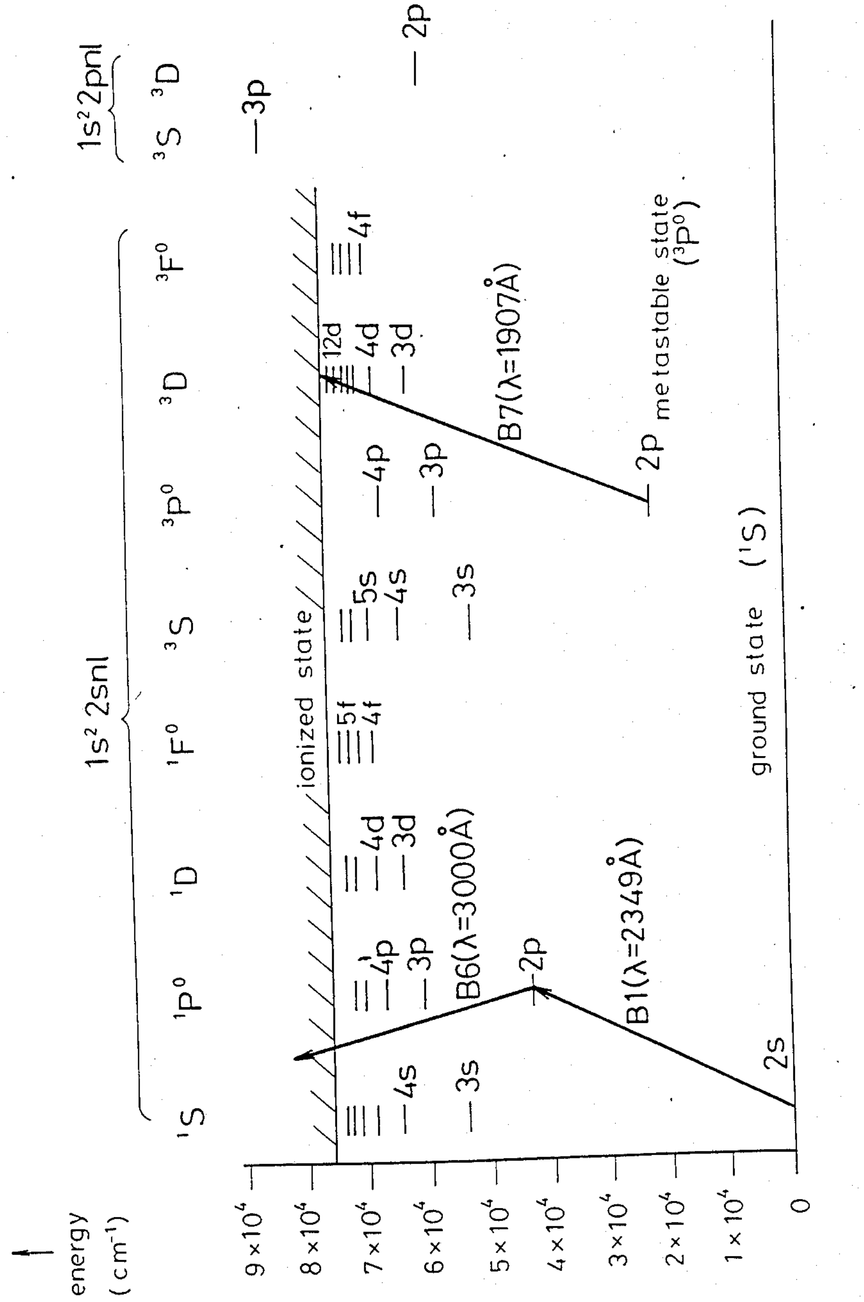
FIG. 9 is a diagram showing the energy levels for a singlet term beryllium neutral atom and the ionization method of the second embodiment of the present invention together with the conventional method.

A second embodiment of the present invention will be described in detail with reference to FIGS. 9 to 13:

FIG. 9 shows the energy levels for a singlet term beryllium neutral atom and the ionization method of the second embodiment together with the conventional method.

According to the conventional method, two laser beams B1, B6 of wavelength 2349 Å and 3000 Å are irradiated to the beryllium vapor to be ionized. Then, the beryllium atom at the ground state $2s(^1S)$ is at first resonance excited to the first excited state $2p(^1P^0)$ by the laser beam B1 of 2349 Å, and thereafter it is ionized by the laser beam B6 of 3000 Å.

On the other hand, according to the second embodiment of the present invention, the beryllium vapor is resonance excited by a gas discharge to an excited state where the metastable state $2p(^3P^0)$ is dominant, and the excited vapor is resonance excited by a synchrotron radiation light beam B7 of wavelength 1907 Å directly to the Rydberg state $12d(^3D)$ from the metastable state.

A synchrotron radiation, especially that having a velocity in a range argued by the theory of relativity, has not only the characteristics of having a directionality similarly as the laser beam but also that of tremendously large intensity and high energy, thereby enabling the excitation of the beryllium vapor to a high excited state from the relatively low excited state by only one beam. The ionization from the Rydberg state as the final excited state is the same as that of the first embodiment.

The ionization method of this second embodiment has almost the same advantages as those of the first embodiment except for that the laser beam should be replaced by a synchrotron radiation.

Figure 10:
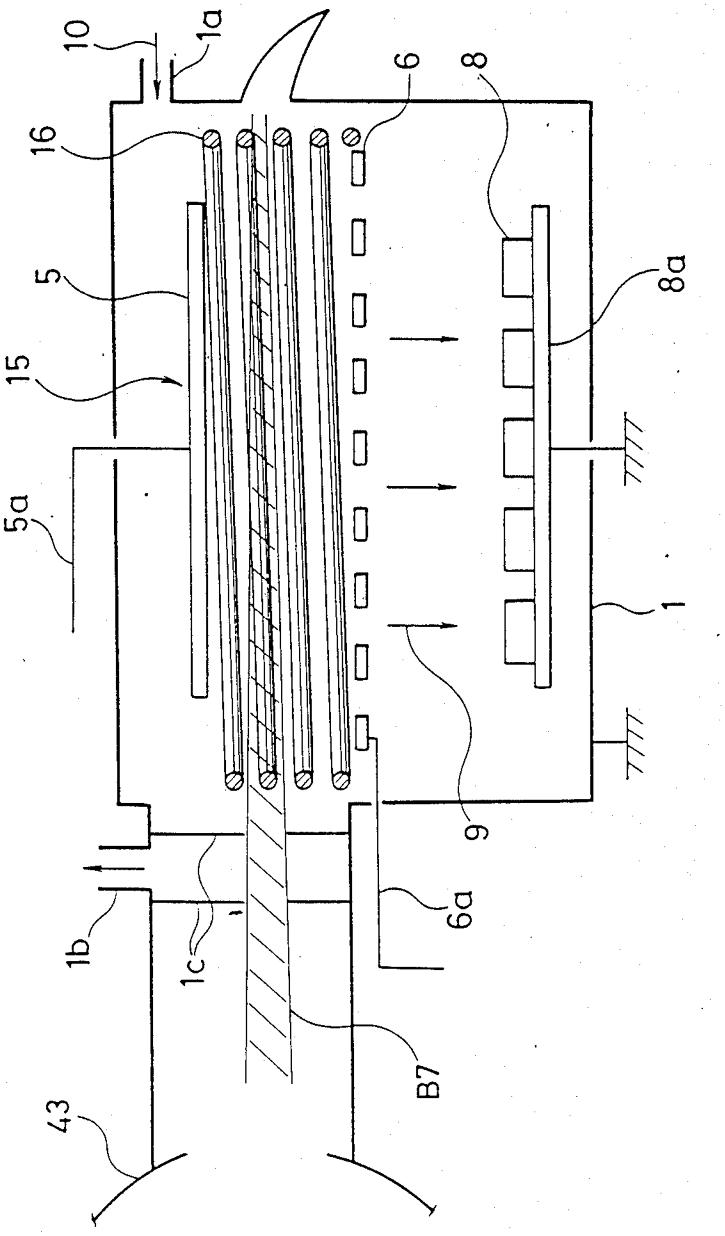
FIG. 10 is a diagram showing a shower type ion beam generator as a second embodiment of the present invention.

FIG. 10 shows a shower type ion beam generator as a second embodiment of the present invention which conducts an ionization of beryllium by a resonance excitation using a synchrotron radiation B7 shown in FIG. 9.

The reference numerals 1, 1*a*, 1*b*, 5, 5*a*, 6, 6*a*, 8, 8*a*, 9, 10 and 16 designate the same or corresponding elements as those shown in FIG. 2. The reference numeral 43 designates a synchrotron radiation generator for generating a synchrotron radiation B7 of 1907 Å having a narrow wavelength width. The numeral 1*c* designates a slit.

The device is operated as follows:

At first, beryllium vapor 10 is introduced into the container 1 from the gas inlet 1*a*. An RF discharge is generated by the induction coil 16, and at the same time the synchrotron radiation generator 43 oscillates to generate a synchrotron radiation B7 of wavelength 1907 Å, and the radiation is introduced into the container 1 through the slit 1*c*. And synchronous with the oscillation a voltage is applied between the electrodes 5 and 6 through the terminals 5*a* and 5*b* and to the induction coil 16. Then, the beryllium vapor 10 is at first excited to the metastable state $2p(^3P^0)$ by the collisions of electrons ocurred by the RF discharge generated by the electrodes 5 and 6 or the induction coil 16 to the beryllium vapor 10 at the ground state, and thereafter the beryllium vapor 10 is resonance excited by the radiation B7 of 1907 Å to the Rydberg state $12d(^3D)$ from the metastable state $2p(^3P^0)$.

Finally, the beryllium vapor 10 at the Rydberg state $12d(^3D)$ is ionized by Stark effect generated by the application of the electric field to the excited vapor. A dc voltage is applied to between the electrode 6 and the material support 8*a*, whereby the ionized beryllium vapor 10 is taken out to be irradiated to the object material 8 as an ion beam 9 consisting of only beryllium ions.

The features of this second embodiment are as follows:

Firstly, in this second embodiment which conducts a selective ionization by utilizing perfectly only resonances, it is possible to obtain a pure beryllium ion beam consisting of only beryllium ions by making the wavelength of the synchrotron radiation not to coincide with the energy level of impurities even if impurities other than beryllium to be ionized such as oxygen, nitrogen, carbon, or hydrogen are contained in the container 1.

Secondly, in this second embodiment which conducts a selective ionization by a resonance excitation, electrons or other elements may not be excited, or may not be heated by an energy absorption. As a result, the object material 8 such as a semconductor substrate to which the ion beam is to be irradiated may not be heated, thereby enabling low temperature processing to be conducted.

Thirdly, in order to change the kind and the characteristics of the ion beam it is enough to change the wavelength of the synchrotron radiation and the intensity of the electric field or the condition of gas discharge, and it is not required to open or close the container for the purpose of taking out the object material or interchanging the ion generating source as required in the conventional device. Accordingly, it is easily possible to conduct a continuous processing of ion injection and annealing, or the like.

Figure 11:
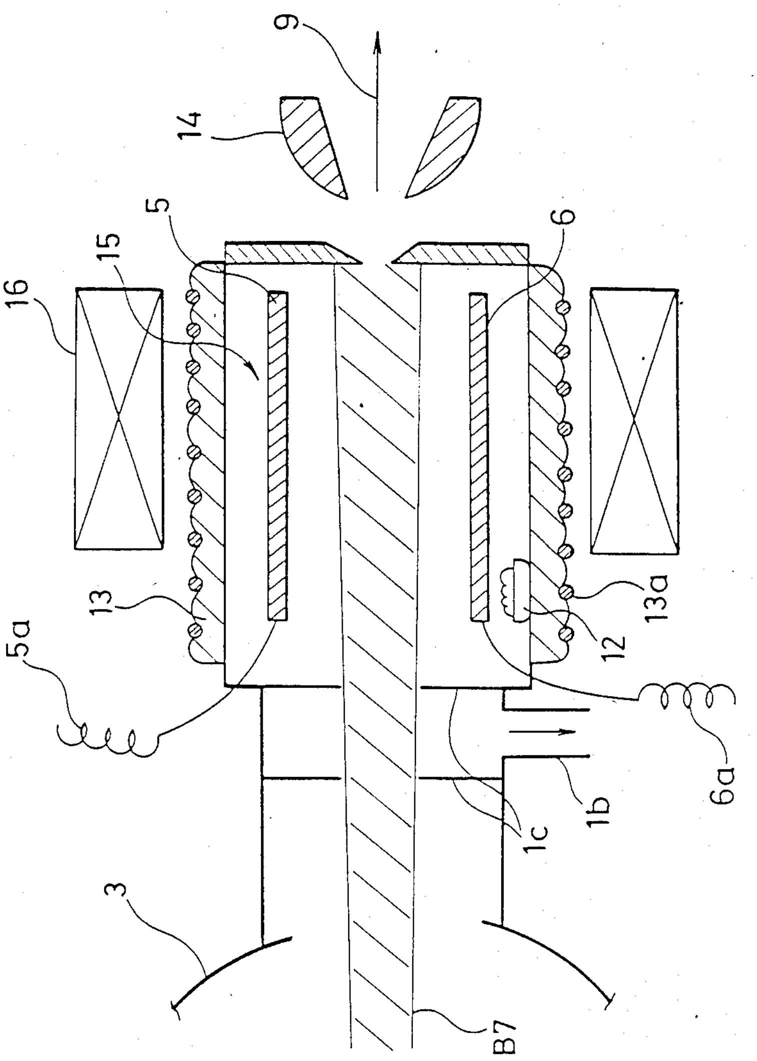
FIG. 11 is a diagram showing a bunching type ion beam generator as a modified version of the second embodiment.

FIG. 11 shows a bunching type ion beam generator as a modified version of the second embodiment.

The same reference numerals designate the same or corresponding elements as those shown in FIG. 10. The reference numeral 13 designates an oven containing the material (beryllium) 12 to be ionized. The numeral 13*a* designates a heater provided surrounding the oven 13. The numeral 11 designates a magnet for bunching the ionized beryllium vapor 10 into the axial center of the container 1. The numeral 14 designates an electrode for taking out the beryllium vapor 10 as an ion beam 9.

This device is operated as follows:

Beryllium to be ionized 12 is inserted into the oven 13, and the oven 13 is heated by the heater 13*a*. Then, beryllium 12 is melted and vaporized to generate a beryllium vapor 10. The synchrotron radiation light beam B7 of 1625 Å is introduced into the oven 13 through the slit 1*c* to be irradiated to the vapor 10, and at the same time a voltage is applied to between the electrodes 5 and 6 so as to generate an electric field and an RF gas discharge. Then, the vapor 10 is excited by the RF gas discharge to the metastable state $2p(^3P^0)$ from the ground state $2s(^1S)$, and it is further excited by the light beam B7 of 1907 Å to the Rydberg state $12d(^3D)$ from the mestable state $2p(^3P^0)$. Furthermore, an electron of the atom of the vapor 10 at the Rydberg state $12d(^3D)$ is separated from the atom to become a free electron by Stark effect or the RF gas discharge, thereby resulting in a beryllium ion. This beryllium ion is bunched into the axial center by the magnet 11, and is taken out as an ion beam 9 by the taking out electrode 14.

Figure 12:
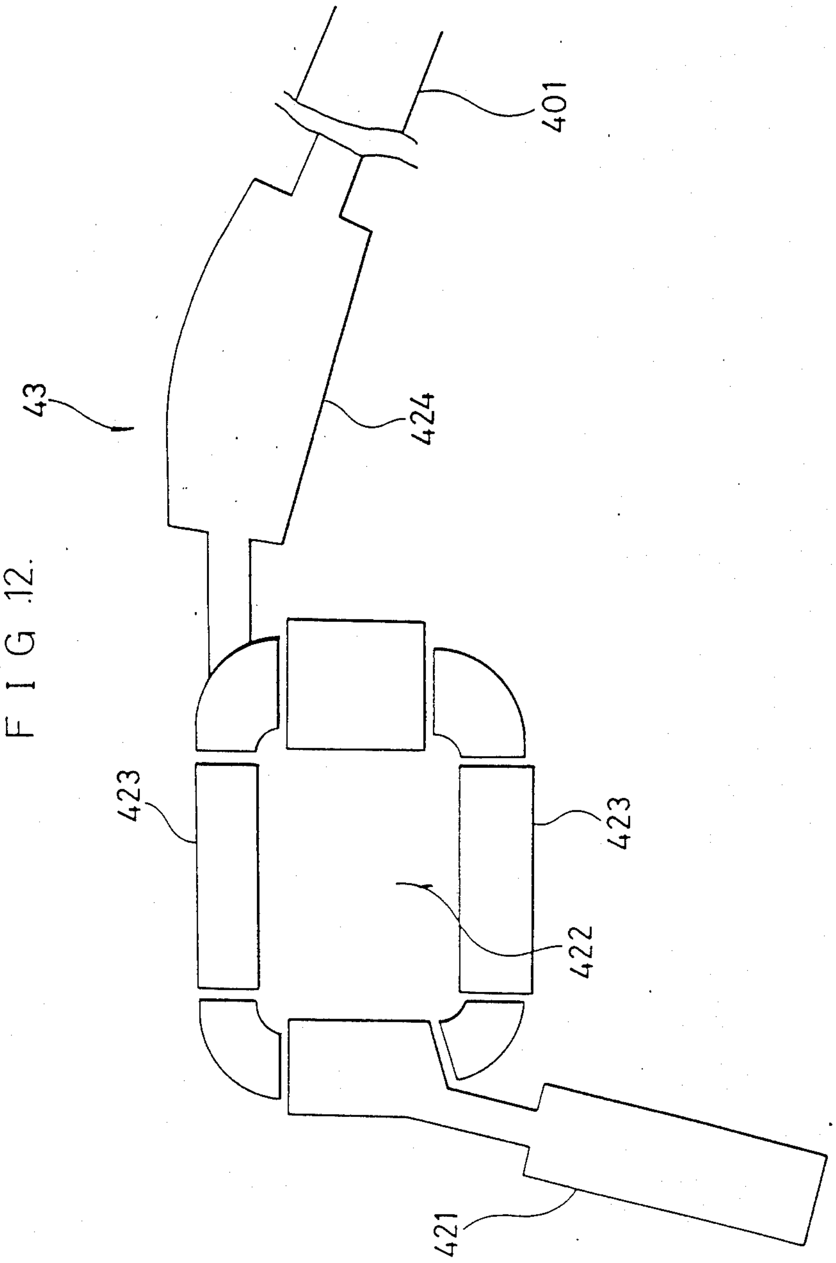
FIG. 12 is a diagram showing a construction of the synchrotron radiation light generator of the second embodiment.

FIG. 12 shows a construction of synchrotron radiation generator 43 of the second embodiment.

The reference numeral 421, 422, 423, 424, and 401 designate a linear accelerator. an electron storage ring, a wiggler or undulator, a spectroscopic system, and a container, respectively.

The synchrotron to be introduced into the container 401 is produced as follows:

Electrons are accelerated by the linear accelerator 421, and injected into the electron storage ring 422. A synchrotron radiation is released from the electrons which are made to have a speed in a range argued by the theory of relativity by the ring 422, and a monowavelength channeling radiation is obtained from the synchrotron radiation output from the ring 422 passing through the spectroscopic system 424.

In this synchrotron radiation generator under such a construction it is possible to obtain a feature of a widened range of wavelength variation by the function of the wiggler or undulator 423 which feature is different from the wavelength variability caused by the spectroscopic system 424.

Figure 13:
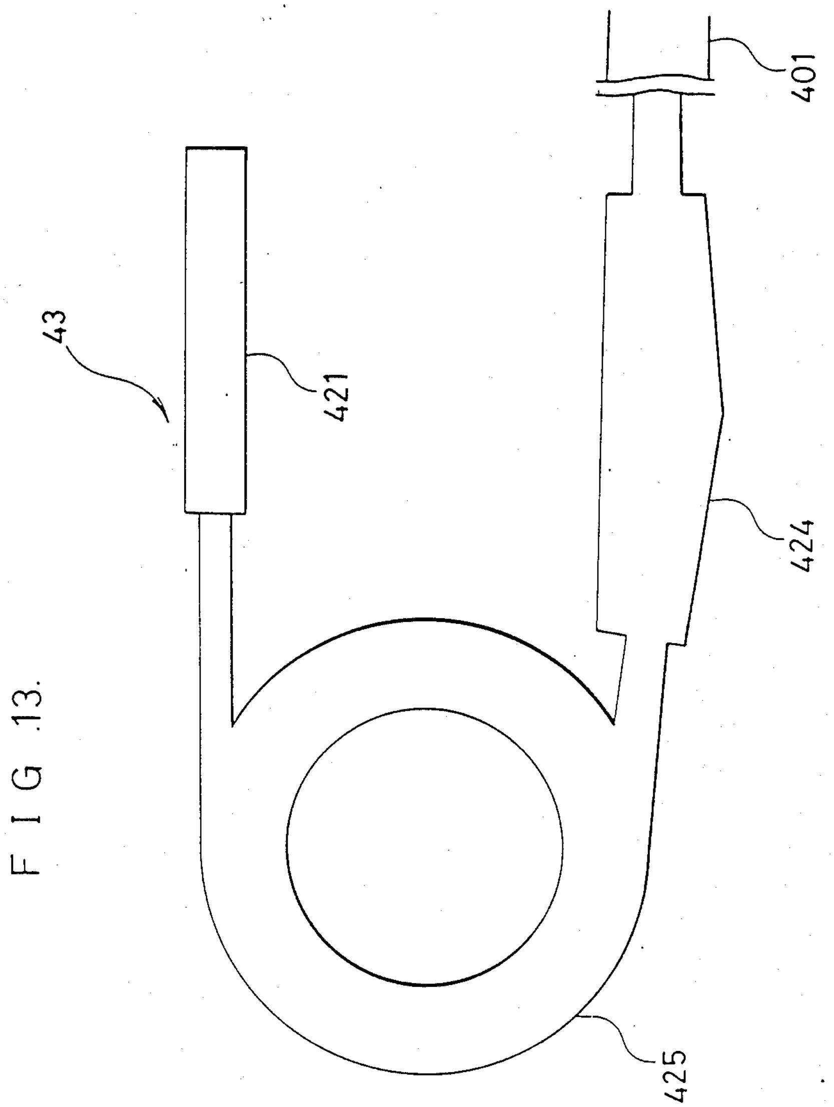
FIG. 13 is a diagram showing a modified version of the synchrotron radiation light generator of the second embodiment.

FIG. 13 shows a modified version of the synchrotron radiation generator 43 of the second embodiment.

The reference numerals 421, 425, 424, and 401 designate a linear accelerator, an electron synchrotron having a circular configuration different from the electron storage ring 422 of FIG. 12, a spectroscopic system, and a container, respectively.

The synchrotron radiation to be introduced into the container 401 is produced as follows:

Electrons are accelerated by the linear accelerator 421, and injected into the electron synchrotron ring 425. A synchrotron radiation is released from the electrons which are made to have a speed in a range argued by the theory of relativity by the electron synchrotron 425, and a mono-wavelength synchrotron radiation is obtained from the synchrotron radiation from the electron synchrotron 425 passing through the spectroscopic system 424.

Figure 14:
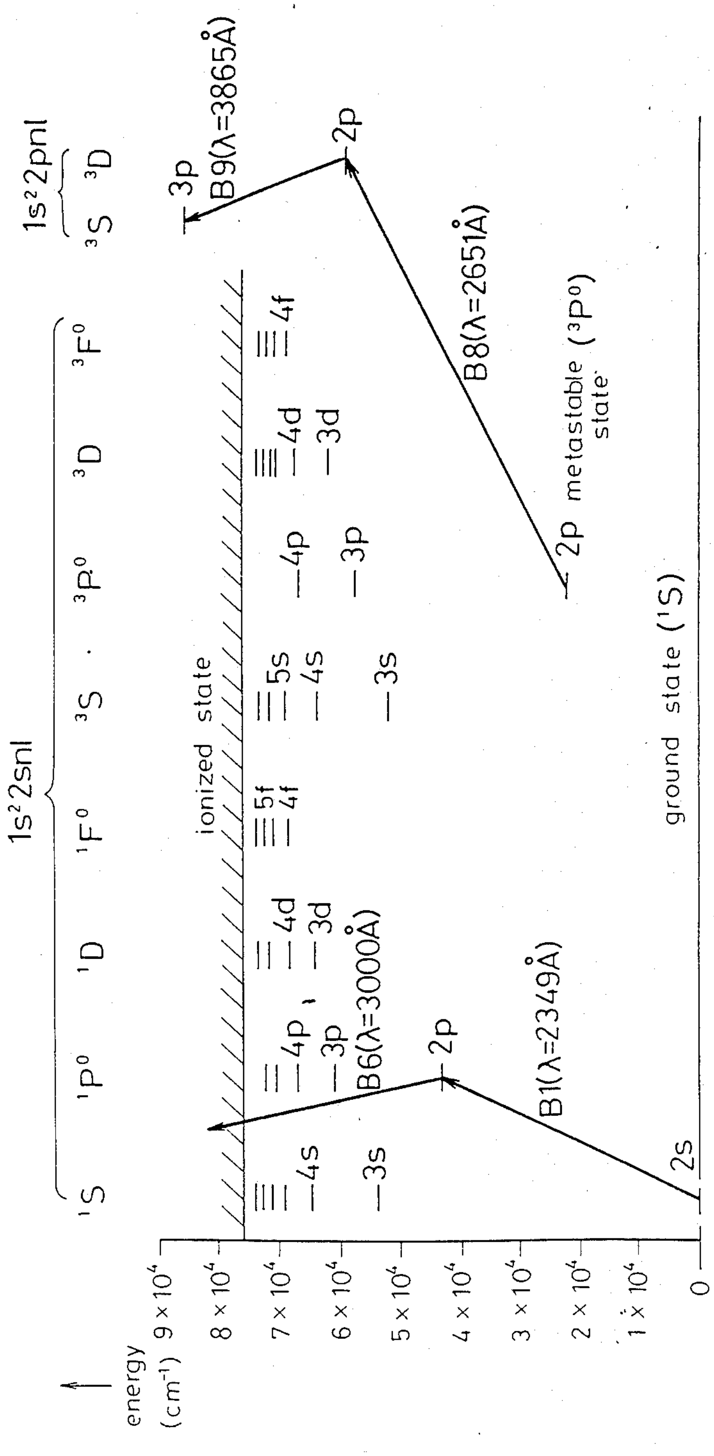
FIG. 14 is a diagram showing the energy levels for a singlet term beryllium neutral atom and the ionization method of the third embodiment of the present invention together with the conventional method.

A third embodiment of the present invention will be described in detail in the following:

FIG. 14 shows the energy levels for a singlet term beryllium atom and the ionizing method of the third embodiment together with the conventional method which is the same as shown in FIG. 9.

According to the third embodiment, beryllium to be ionized is excited to the metastable state $2p(^3P^0)$ by a gas discharge, and it is resonance excited by a laser beam, or stepwisely resonance excited by a plurality of laser beams to the autoionization state from the metastable state. For example, the beryllium vapor is resonance excited by the laser beam B8 of wavelength 2651 Å to the excited state $1s^22p^2(^3D)$ from the metastable state, and at the same time it is resonance excited by the laser beam B9 of wavelength 3865 Å to the autoionization state $1s^22p3p(^3S)$ from the excited state $1s^22p^2(^3D)$. Thereafter it is autoionized to the ionized state with a predetermined transition probability from the autoionization state.

The ionization method of this third embodiment has an advantage that the collision cross-sectional area at the ionization is higher by several figures or more than the direct ionization from the energy level $2p(^1P^0)$ of the vonventional method, thereby enabling to lower the output energy of the laser beam. Furthermore, it is possible to selectively ionize only the material to be ionized by selecting the wavelength of the laser beam so as to not coincide with the energy level of impurity atoms because the present invention utilizes perfectly only resonances.

Furthermore, it is easily possible to generate ion beams of other materials by varying the wavelength of the laser beam. For that purpose, many kinds of materials to be ionized may be previously introduced into the container of the ion beam generator. This further provides capability of conducting two or more ion beam processings successively.

The device of the third embodiment is constituted to include a gas discharge means for exciting the beryllium vapor to the metastable state $2p(^3P^0)$ from the ground state, and a laser beam generator which conducts a stepwise resonance excitation of beryllium vapor to the autoionization state $1s^22p3p(^3S)$ from the metastable state $2p(^3P^0)$ through an intermediate excited state $1s^22p^2(^3D)$ by a laser beam B8 of 2651 Å and a laser beam B9 of 3865 Å.

The devices of FIGS. 2 and 3 can be used as devices of this third embodiment by only replacing the laser beam B3, B5 and B4 by B8 and B9, respectively. However, the electrodes 5 and 6 are unnecessary as far as they are used only for an electric field generator. That is, the electrode 5 can be removed in the device of FIG. 2, and both of the electrodes 5 and 6 can be removed in the device of FIG. 3.

The laser beam generator of FIG. 4 and the first to third modified versions thereof of FIG. 5 to 8 can be used as the laser beam generator of this third embodiment.

A fourth embodiment of the present invention will be described in detail in the following.

Figure 15:
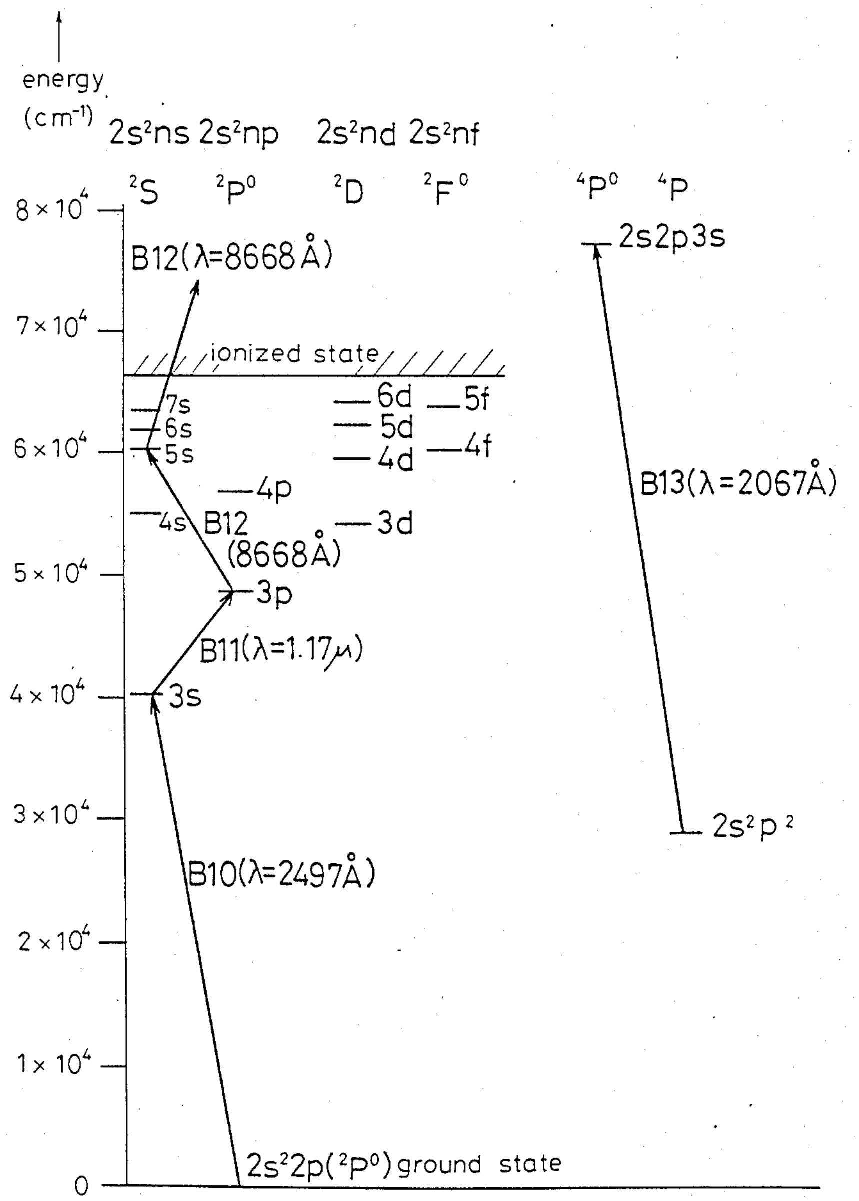
FIG. 15 is a diagram showing the energy levels for a singlet term boron neutral atom and the ionization method of the fourth embodiment of the present invention together with the conventional method.

FIG. 15 shows the energy levels for a singlet term boron neutral atom and the ionization method of the fourth embodiment together with the conventional method.

According to the conventional method, three laser beams B10, B11, B12 of wavelength 2497 Å, 1.17 μm, 8668 Å are irradiated to the boron vapor to be ionized. Then, the boron atom at the ground state $2s^22p(^2P^0)$ is at first resonance excited to the first excited state $3s(^2S)$ by the laser beam B10 of 2497 Å, and thereafter it is resonance excited to the second and third excited state $3p(^2P^0)$ and $5s(^2S)$ by the laser beam B11 of 1.17μ m and B12 of 8668 Å, successively, and furthermore it is finally ionized by the laser beam B12.

On the other hand, according to the fourth embodiment of the present invention, the boron vapor is at first excited to the metastable state $2s^2P^2$ by a gas discharge, and thereafter it is resonance excited by a synchrotron radiation B13 of wavelength 2067 Å directly to the autoionization state $2s2p3s$ from the metastable state $2s^2p^2$. The synchrotron radiation light beam, having the above-described characteristics of directionality and that of tremendously large intensity and high energy enables the excitation of the boron vapor to a high excited state from the relatively low excited state by only one beam. The ionization from the autoionization state is the same as that of the third embodiment.

The ionization method of this fourth embodiment has almost the same advantages as those of the third embodiment except for that the laser beam should be replaced by a synchrotron radiation.

The device of this fourth embodiment is constituted to include a gas discharge means for exciting the boron vapor to the metastable state $2s^2p^2$ from the ground state and a synchrotron radiation generator which conducts a resonance excitation of the boron vapor to the autoionization state $2s2p3s$ from the metastable state of a synchrotron radiation B13 of 2067 Å.

The devices of FIGS. 10 and 11 can be used as devices of this fourth embodiment by only replacing the light B7 by B13. However, the electrode 5 can be removed in the device of FIG. 10, and both of the electrodes 5 and 6 can be removed in the device of FIG. 11.

The synchrotron radiation generators of FIGS. 12 and 13 can be used as the synchrotron radiation light beam generator of this fourth embodiment.

As evident from the foregoing description, according to the present invention, the material to be ionized is excited to a relatively low excited state by a gas discharge, and it is resonance excited to an intermediate state such as the Rydberg state or the autoionization state from the low excited state by a light having a predetermined wavelength, and is ionized from that state by some means. Accordingly, only the desired material is ionized, thereby enhancing the ionization efficiency and the selectivity of ions to a great extent.

What is claimed is:

1. An ion beam generator, which comprises:

an ion generating section for wherein a first material to be ionized is introduced;

gas discharge means for exciting said first material to be ionized to a low excited state;

light source means for introducing a light into the ion generating section which light has a wavelength such that it excites said first material to be ionized to an intermediate state from the low excited state of said first material by a resonance excitation;

a pair of electrodes for generating a first electric field for ionizing said first material excited to said intermediate state using the Stark effect; and material support means for supporting a second material to which ions produced by the ionizing of said first material are irradiated, said material support means being heard as an electrode for generating a second electric field in cooperation with one of said pair of electrodes, said second electric field introducing said ions to said material.

2. An ion beam generator as defined in claim 1, wherein the low excited state is a metastable state.

3. An ion beam generator as defined in claim 1, wherein the light source mean comprises one which generates lights of two or more specific wavelengths so as to excite the material to the intermediate state by a stepwise resonance excitation.

4. An ion beam generator as defined in claim 2, wherein the light source means comprises one which generates lights of two or more specific wavelengths so as to excite the material to the intermediate state by a stepwise resonance excitation.

5. An ion beam generator as defined in claim 1, wherein the intermediate state is a Rydberg state.

6. An ion beam generator as defined in claim 2, wherein the intermediate state is a Rydberg state.

7. An ion beam generator as defined in claim 3, wherein the intermediate state is a Rydberg state.

8. An ion beam generator as defined in claim 4, wherein the intermediate state is a Rydberg state.

9. An ion beam generator as defined in claim 5, wherein the light source means comprises one or more laser(s) excited by an excitation laser.

10. An ion beam generator as defined in claim 6, wherein the light source means comprises one or more laser(s) excited by an excitation laser.

11. An ion beam generator as defined in claim 7, wherein the light source means comprises one or more laser(s) excited by an excitation laser.

12. An ion beam generator as defined in claim 8, wherein the light source means comprises one or more laser(s) excited by an excitation laser.

13. An ion beam generator as defined in claim 5, wherein the light source means comprises one or more dye laser(s) excited by a flash lamp.

14. An ion beam generator as defined in claim 6, wherein the light source means comprises one or more dye laser(s) excited by a flash lamp.

15. An ion beam generator as defined in claim 7, wherein the light source means comprises one or more dye laser(s) excited by a flash lamp.

16. An ion beam generator as defined in claim 8, wherein the light source means comprises one or more dye laser(s) excited by a flash lamp.

17. An ion beam generator as defined in claim 5, wherein the light source means comprises two or more laser(s) which oscillate synchronously with each other, triggered by an electric pulse signal.

18. An ion beam generator as defined in claim 6, wherein the light source means comprises two or more laser(s) which oscillate synchronously with each other, triggered by an electric pulse signal.

19. An ion beam generator as defined in claim 7, wherein the light source means comprises two or more laser(s) which oscillate synchronously with each other, triggered by an electric pulse signal.

20. An ion beam generator as defined in claim 8, wherein the light source means comprises two or more laser(s) which oscillate synchronously with each other, triggered by an electric pulse signal.

21. An ion beam generator as defined in claim 5, wherein the light source mean comprises one which generates one or more mono-wavelength light(s) each obtained from a synchrotron radiation source passing through a spectroscopic system.

22. An ion beam generator as defined in claim 6, wherein the light source means comprises one which generates one or more mono-wavelength light(s) each obtained from a synchrotron radiation source passing through a spectroscopic system.

23. An ion beam generator as defined in claim 5, wherein the light source means comprises one which generates one or more mono-wavelength light(s) each obtained from a channeling radiation source passing through a spectroscopic system.

24. An ion beam generator as defined in claim 6, wherein the light source means comprises one which generates one or more mono-wavelength light(s) each obtained from a channeling radiation source passing through a spectroscopic system.

25. An ion beam generator, which comprises:

an ion generating section wherein a first material to be ionized is introduced;

gas discharge means for exciting said first material to be ionized to a low excited state;

light source means for introducing a light into said ion generating section which light has a wavelength such that it excites said first material to be ionized to a Rydberg state from said low excited state of said first material by a resonance excitation;

a pair of electrodes for generating an electric field for ionizing said first material excited to the Rydberg state by the Stark effect; and material support means for supporting a second material to which ions produced by the ionizing of said first material are irradiated, said support means being biased as an electrode for generating an ion taking out electric field in cooperation with one of said pair of electrodes.

26. An ion beam generator as defined in claim 25, wherein said light source means comprises one or more dye laser(s) excited by an excitation laser.

27. An ion beam generator as defined in claim 25, wherein said light source means comprises one or more dye laser(s) excited by a flash lamp.

28. An ion beam generator as defined in claim 25, wherein said light source means comprises two or more laser(s) which oscillate synchronously with each other trigerred by an electric pulse.

29. An ion beam generator as defined in claim 25, wherein said light source means comprises one which generates one or more mono-wavelength light(s) each obtained from a synchrotron radiation source passing through a spectroscopic system.

30. An ion beam generator as defined in claim 25, wherein said light source means comprises one which generates one or more mono-wavelength light(s) each obtained from a channeling radiation source passing through a spectroscopic system.

* * * * *